(12) United States Patent
Zhao et al.

(10) Patent No.: US 12,712,148 B2
(45) Date of Patent: Aug. 18, 2026

(54) CHARGED PARTICLE BEAM DEVICE, CHARGED PARTICLE BEAM SYSTEM, AND ADJUSTMENT METHOD

(71) Applicant: Hitachi High-Tech Corporation, Tokyo (JP)

(72) Inventors: Jinyu Zhao, Tokyo (JP); Ayumi Doi, Tokyo (JP); Aoi Yamauchi, Tokyo (JP); Shuichiro Takahashi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 440 days.

(21) Appl. No.: 18/203,430

(22) Filed: May 30, 2023

(65) Prior Publication Data

US 2023/0386781 A1 Nov. 30, 2023

(30) Foreign Application Priority Data

May 31, 2022 (JP) ................................ 2022-088354

(51) Int. Cl.

*H01J 37/244* (2006.01)
*G01N 23/2251* (2018.01)
*H01J 37/28* (2006.01)
*H03G 3/30* (2006.01)

(52) U.S. Cl.

CPC ........ *H01J 37/244* (2013.01); *G01N 23/2251* (2013.01); *H01J 37/28* (2013.01); *H03G 3/3036* (2013.01); *H01J 2237/2448* (2013.01); *H01J 2237/24495* (2013.01); *H03G 2201/103* (2013.01)

(58) Field of Classification Search

CPC .. H01J 37/244; H01J 37/28; H01J 2237/2448; H01J 2237/24495; H01J 2237/2826; H01J 37/265; H01J 37/26; H01J 37/222; G01N 23/2251; H03G 3/3036; H03G 2201/103

See application file for complete search history.

(56) References Cited

U.S. PATENT DOCUMENTS

| | | | | |
|---|---|---|---|---|
| 7,569,819 | B2 | 8/2009 | Mori | |
| 10,658,152 | B1 * | 5/2020 | Hendrich | H01J 37/244 |
| 10,991,542 | B2 * | 4/2021 | Watanabe | H01J 37/10 |
| 2011/0108718 | A1 * | 5/2011 | Jones | G01T 1/178 250/252.1 |
| 2014/0061455 | A1 | 3/2014 | Ishii et al. | |
| 2017/0336335 | A1 * | 11/2017 | Hendrich | G01N 23/2251 |
| 2021/0183611 | A1 * | 6/2021 | Tomizawa | G06T 5/94 |
| 2021/0217580 | A1 * | 7/2021 | Ootsuga | H01J 37/244 |

(Continued)

FOREIGN PATENT DOCUMENTS

JP 5798099 B2 10/2015

*Primary Examiner* — David A Vanore

(74) *Attorney, Agent, or Firm* — Crowell & Moring LLP

(57) ABSTRACT

To correct a difference in signal intensity due to a difference in hardware, for example, temporal deterioration of the hardware in the same device, or a difference in signal intensity between different devices. An adjustment method according to the disclosure specifies an amplification gain with which the same detection signal intensity as that of a comparison target is obtained by comparing correspondence relationships between the detection signal intensity and the amplification gain at different time points in the same charged particle beam device or among different charged particle beam devices.

16 Claims, 7 Drawing Sheets

(56) References Cited

U.S. PATENT DOCUMENTS

| | | | | |
|---|---|---|---|---|
| 2022/0189755 | A1* | 6/2022 | Sumigama | H01J 49/0036 |
| 2022/0246392 | A1* | 8/2022 | Yamamoto | H01J 37/265 |
| 2022/0270847 | A1* | 8/2022 | Ikeda | H01J 37/222 |
| 2023/0059414 | A1* | 2/2023 | Oinuma | H01J 37/244 |
| 2023/0386781 | A1* | 11/2023 | Jinyu | H01J 37/28 |
| 2024/0297012 | A1* | 9/2024 | Shintani | H01J 37/1474 |

* cited by examiner

CHARGED PARTICLE BEAM DEVICE, CHARGED PARTICLE BEAM SYSTEM, AND ADJUSTMENT METHOD

TECHNICAL FIELD

The present disclosure relates to a charged particle beam device that irradiates a sample with a charged particle beam.

BACKGROUND ART

In order to measure a shape or dimensions of a semiconductor pattern formed on a semiconductor wafer, an electron microscope technique is widely used. A signal obtained by irradiating a sample having a semiconductor pattern with an electron beam is generally visualized in a form of an image. It is widely performed to acquire the image by auto brightness and contrast control (ABCC) such that luminance distribution effectively uses an image depth. However, a signal intensity itself may contain information such as the shape or the dimensions of the semiconductor pattern, and in this case, it is necessary to maintain a constant signal intensity for imaging.

PTL 1 describes a method in which, even when an acceleration voltage and a probe current value are changed and/or observation is performed by different devices, the same atomic number difference leads to the same signal amount and contrast. PTL 2 describes a method for adjusting an image signal amount and contrast by image processing.

CITATION LIST

Patent Literature

PTL 1: U.S. Pat. No. 7,569,819B

PTL 2: Japanese Patent No. 5798099

SUMMARY OF INVENTION

Technical Problem

In PTL 1, with a signal intensity obtained by measuring a reference sample using a specific acceleration voltage and a probe current as a reference, the signal intensity can be made uniform by adjusting an operating voltage of a photomultiplier tube when the acceleration voltage, the probe current, and an average atomic number of a sample are changed. In PTL 2, an instruction is given to an image adjustment unit to make luminance and contrast of an image uniform.

Thus, in the related art, a technique of reducing differences between signal amounts acquired when a measurement condition is changed, or acquired by different devices is proposed. However, due to deterioration of hardware (for example, a detector or a signal amplifier), the same signal intensity may not be obtained even when the same measurement is performed using the same setting.

In view of the above problem, an object of the disclosure is to correct a difference in signal intensity due to a difference in hardware, for example, temporal deterioration of the hardware in the same device, or a difference in signal intensity between different devices.

Solution to Problem

An adjustment method according to the disclosure specifies an amplification gain with which the same detection signal intensity as that of a comparison target is obtained by comparing correspondence relationships between the detection signal intensity and the amplification gain at different time points in the same charged particle beam device or among different charged particle beam devices.

Advantageous Effects of Invention

According to the adjustment method of the disclosure, it is possible to obtain the same detection signal amount for the same pattern by correcting an influence due to a change in hardware (an elapsed time or a change in device).

DESCRIPTION OF EMBODIMENTS

Embodiment 1

Figure 1:
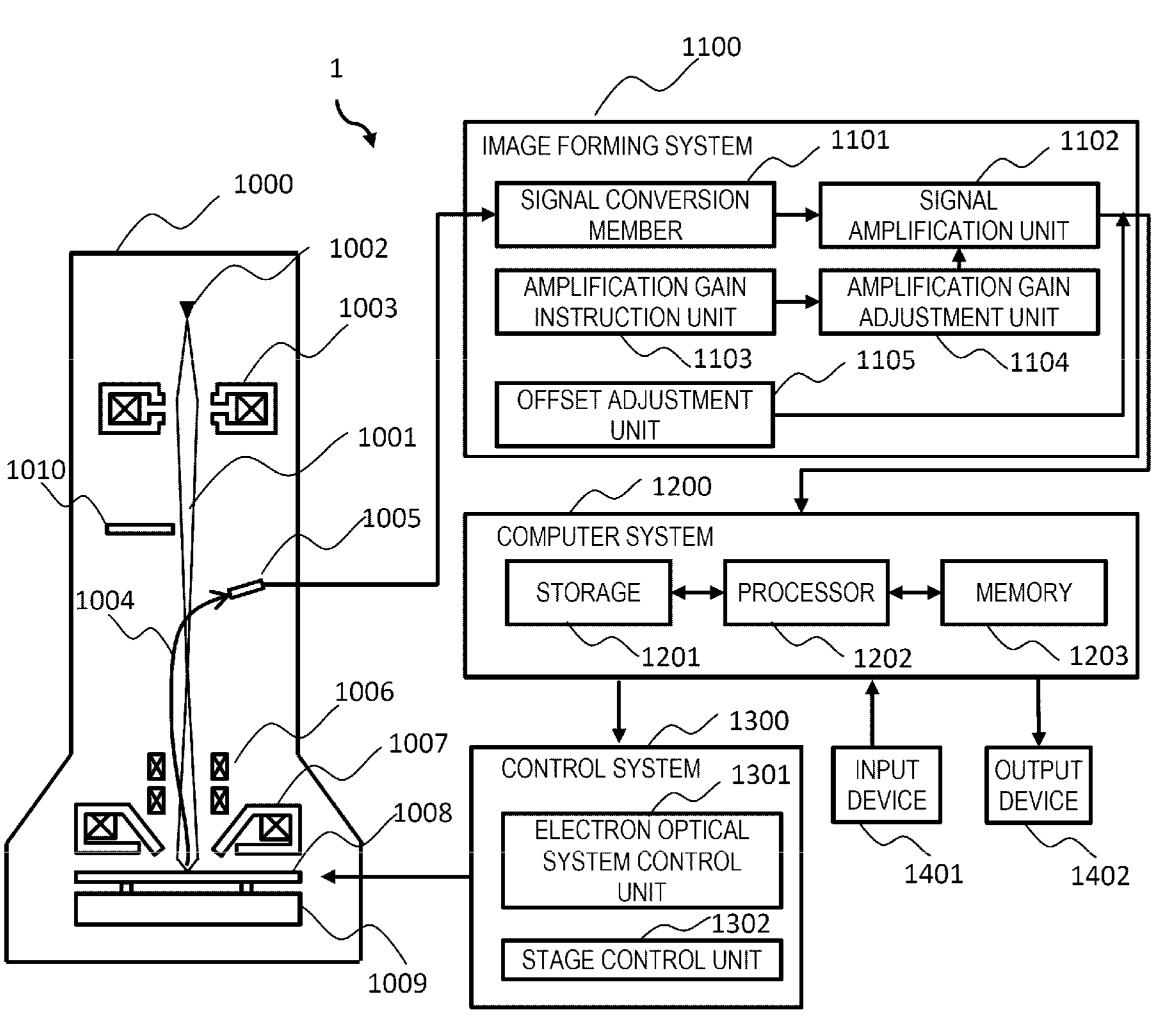
FIG. 1 is a block diagram showing a schematic configuration of an electron microscope 1 according to Embodiment 1.

FIG. 1 is a block diagram showing a schematic configuration of an electron microscope 1 according to Embodiment 1 of the disclosure. The electron microscope 1 is a device that generates an observation image by irradiating a sample with an electron beam. The electron microscope 1 includes a lens barrel portion 1000, an image forming system 1100, a computer system 1200, a control system 1300, an input device 1401, and an output device 1402.

An electron gun 1002 that generates an electron beam 1001 is disposed inside the lens barrel portion 1000. The electron beam 1001 is converged by a condenser lens 1003 and focused on a sample 1008 by an objective lens 1007. The electron beam 1001 scans the sample 1008 via a deflector 1006, and a signal electron 1004 is emitted and detected by a detector 1005. The detector 1005 outputs a detection signal representing an intensity of the signal electron 1004. A stage 1009 holds the sample 1008 and moves a region to be observed in the sample 1008 under the electron beam 1001. A circuit breaker 1010 is installed in the lens barrel portion 1000, so that the sample 1008 can be prevented from being irradiated with the electron beam 1001. The circuit breaker 1010 may block the electron beam 1001 by inserting an obstacle on a path of the electron beam 1001, or may block the electron beam 1001 by deflecting the electron beam 1001 to retreat from the sample 1008 by applying an electric field or a magnetic field.

The image forming system 1100 includes a signal conversion member 1101 that converts the signal electron 1004 into an electric signal or the like, and a signal amplification unit 1102 that amplifies the converted signal. An amplification gain of the signal amplification unit 1102 is adjusted by an operation of an amplification gain adjustment unit based on an instruction value designated by an amplification gain instruction unit 1103. An offset of the signal amplification unit 1102 is adjusted by an offset adjustment unit 1105. Representative examples of the signal conversion member 1101 include, but are not limited to, a scintillator, a semiconductor detector, a solid-state electron multiplier element (silicon photo multiplier), and a micro channel plate. The signal amplification unit 1102 is determined by selection of the signal conversion member 1101. A photomultiplier tube is used for the scintillator, and a preamplifier circuit is used for the semiconductor detector. As a solid-state electron multiplier tube and the micro channel plate, the signal conversion member 1101 may include the signal amplification unit 1102. The instruction value designated by the amplification gain instruction unit 1103 does not necessarily coincide with the amplification gain. For example, for the photomultiplier tube, the instruction value uses a voltage value applied to the photomultiplier tube, and the amplification gain has a characteristic of increasing in an exponential manner with respect to the applied voltage.

The computer system 1200 includes a storage 1201, a processor 1202, and a memory 1203. The storage 1201 and the memory 1203 store data to be used by the processor 1202. The processor 1202 acquires the detection signal of the detector 1005 from the image forming system 1100, and generates an observation image of the sample 1008 using the detection signal.

The control system 1300 includes an electron optical system control unit 1301 that controls the lens barrel portion 1000, and a stage control unit 1302 that controls an operation of the stage 1009.

Figure 2:
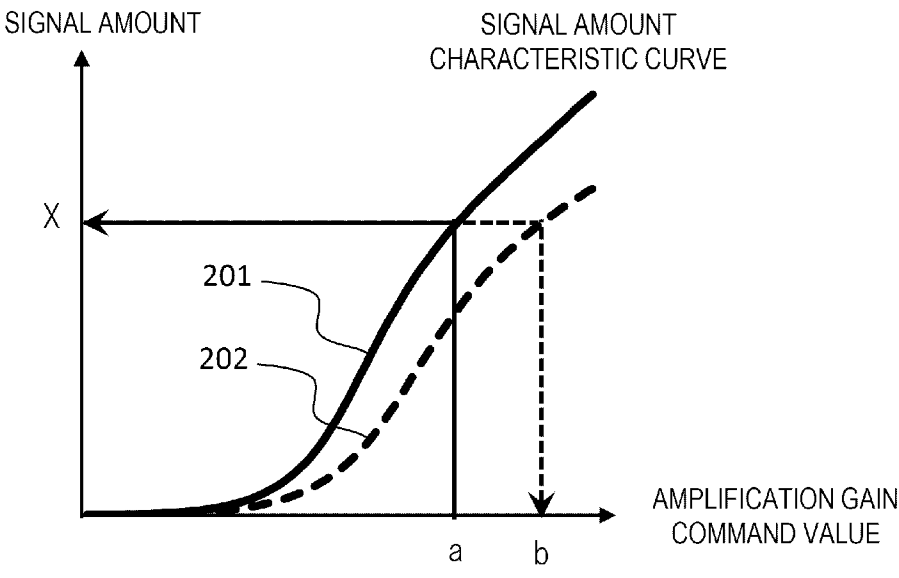
FIG. 2 is an example of a characteristic curve representing a relationship between a detection signal amount and an amplification gain command value.

FIG. 2 is an example of a characteristic curve representing a relationship between a detection signal amount and an amplification gain command value. In an electron microscope (device A), the signal electron 1004 generated from the sample 1008 is detected by the detector 1005, passes through the signal conversion member 1101 and is amplified by the signal amplification unit 1102, thereby obtaining a signal intensity. At this time, by acquiring the signal intensity while changing the instruction value designated by the amplification gain instruction unit 1103, it is possible to acquire a signal amount characteristic curve with a horizontal axis representing the instruction value and a vertical axis representing the signal amount. A solid line 201 in FIG. 2 indicates this example.

When a signal amount characteristic curve is similarly acquired in another electron microscope (device B) having the same configuration as that of the device A, the curve does not coincide with the curve 201 and is, for example, a broken line 202 even when the same sample 1008 is used due to characteristic variations of the signal conversion member 1101 and the signal amplification unit 1102 in general. This corresponds to a fact that even if the same amplification gain instruction value is given, the signal amount of the device B is lower than the signal amount of the device A. When a signal intensity X is obtained with respect to a command value a in the device A, the same signal amount can be obtained using a command value b in the device B. The signal amount does not necessarily need to be strictly the same, and a signal amount within a range in which necessary measurement accuracy or sensitivity is obtained may be obtained in each device.

According to this principle, the computer system 1200 designates the amplification gain in each device such that the same detection signal intensity can be obtained between the devices A and B. For example, when the amplification gain is adjusted in the device B, the computer system 1200 of the device B may instruct a gain b to the image forming system 1100, and the amplification gain instruction unit 1103 and the amplification gain adjustment unit 1104 may adjust the gain according to the instruction. The same applies to an adjustment in the device A.

In this manner, signal characteristic curves of a plurality of devices and the signal intensity X to be obtained are stored in the storage 1201 in advance, and thus command values to be set in respective devices are given, and the same signal intensity can be obtained in all the devices. How to select a signal amount X (or a gain a and the gain b) commonly used between the devices will be described later with reference to FIG. 5.

Figure 3:
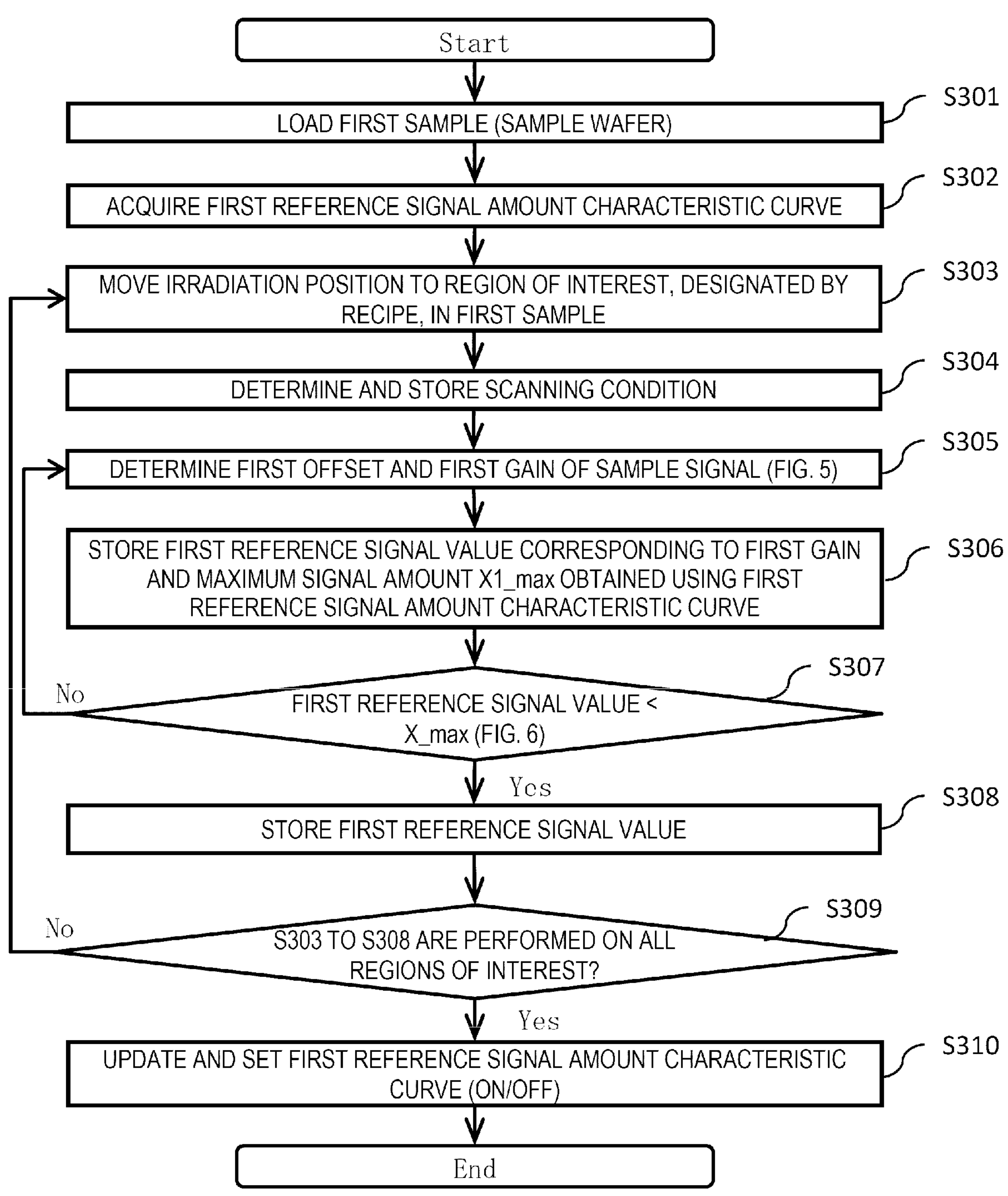
FIG. 3 is a flowchart showing a procedure for acquiring a curve 201 in a device A described in FIG. 2.

FIG. 3 is a flowchart showing a procedure for acquiring the curve 201 in the device A described in FIG. 2. The same procedure may be performed in the device B. This is because the signal amount characteristic curve in the device B may also be used by another electron microscope (including the device A). Hereinafter, each step in FIG. 3 will be described.

(FIG. 3: Steps S301 to S302)

A first sample (sample wafer) is loaded into the lens barrel portion 1000 (S301). The computer system 1200 acquires a signal amount characteristic curve (first reference signal amount characteristic curve) of a first reference sample by acquiring a detection signal intensity while changing an amplification gain (S302). The first sample is a sample to be observed. The first reference sample is a sample prepared in advance as, for example, a calibration sample separately from the first sample.

(FIG. 3: Steps S303 to S304)

The computer system 1200 moves an irradiation position of the electron beam 1001 to a region of interest designated by a recipe configured to measure the first sample (S303). Specifically, the control system 1300 moves a position of the stage to the irradiation position or the vicinity of the irradiation position, and adjusts a deflection amount of the deflector 1006 as necessary. The computer system 1200 determines a condition for scanning with the electron beam 1001 and stores the condition in the storage 1201 (S304).

(FIG. 3: Step S305)

The computer system 1200 determines the amplification gain by the amplification gain adjustment unit 1104 and determines the offset by the offset adjustment unit 1105. In this step, zero point adjustment (offset) is performed on the detection signal, and a gain (first gain) suitable for observing the first sample is determined. Details of this step will be described later.

(FIG. 3: Step S306)

The computer system 1200 acquires a first reference signal value corresponding to the first gain by referring to the first reference signal amount characteristic curve using the first gain in S305. The computer system 1200 further acquires a maximum signal amount X1_max on the first reference signal amount characteristic curve. A significance of X1_max will be described later in association with a minimum signal value among the plurality of devices.

(FIG. 3: Step S307)

The computer system 1200 checks whether the first reference signal value acquired in S306 is smaller than X_max. When this condition is not satisfied, the process returns to S305 to reset the offset and the gain. A significance of X_max will be described later in association with the minimum signal value among the plurality of devices.

(FIG. 3: Steps S308 to S309)

The computer system 1200 stores the determined first reference signal value in the storage 1201 (S308). S303 to S308 are performed for all the regions of interest (S309).

(FIG. 3: Step S310)

The computer system 1200 determines whether to update the characteristic curve acquired before execution of this flowchart with a characteristic curve newly acquired in S403 to be described later based on, for example, selection by a user.

Figure 4:
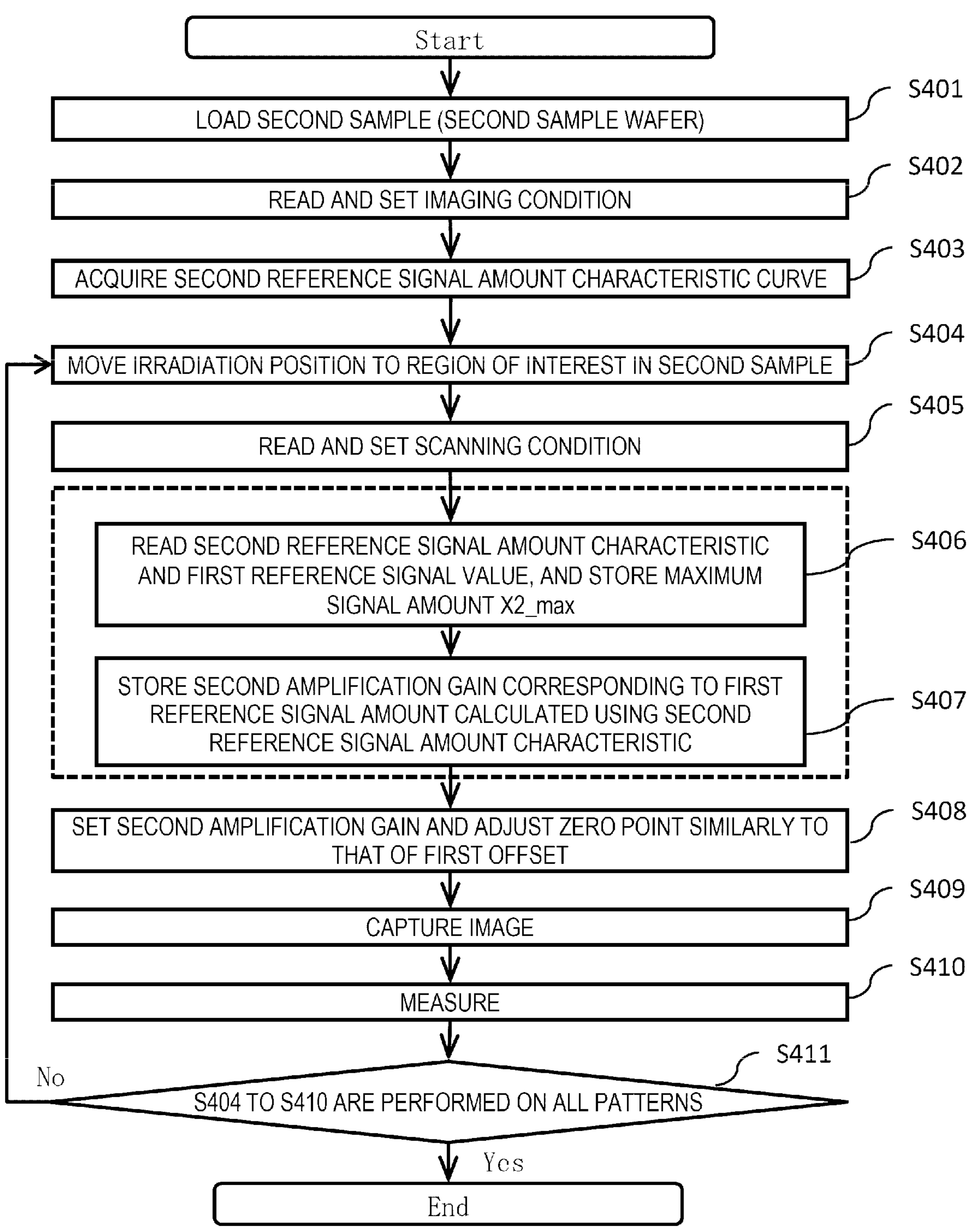
FIG. 4 is a flowchart showing a procedure for observing a sample in a device B described in FIG. 2.

FIG. 4 is a flowchart showing a procedure for observing a sample in the device B described in FIG. 2. When the sample is observed in the device A, the same procedure as in FIG. 4 is used for execution. Hereinafter, each step in FIG. 4 will be described.

(FIG. 4: Steps S401 to S403)

A second sample (second sample wafer) is loaded into the lens barrel portion 1000 (S401). The computer system 1200 reads an imaging condition for acquiring an observation image of the second sample, and sets the condition in each unit (S402). The computer system 1200 acquires a signal amount characteristic curve of a second reference sample (second reference signal amount characteristic curve) by acquiring a detection signal intensity while changing an amplification gain (S403). The second sample is a sample to be observed in the device B. The second reference sample is a sample having the same role as the first reference sample in the device B.

(FIG. 4: Steps S404 to S405)

The computer system 1200 moves the irradiation position of the electron beam 1001 to a region of interest designated by a recipe configured to measure the second sample (S404). The computer system 1200 reads a condition for scanning with the electron beam 1001 and sets the condition in each unit (S405).

(FIG. 4: Steps S406 to S407)

By referring to the second reference signal amount characteristic using the first reference signal value determined in FIG. 3, the computer system 1200 specifies a second gain with which a signal intensity substantially equivalent to the first reference signal value is obtained in the second reference signal amount characteristic (S407). The computer system 1200 also acquires a maximum signal amount X2_max on the second reference signal amount characteristic curve (S406).

(FIG. 4: Steps S406 to S407: Supplement 1)

The device A sets the amplification gain (second gain) so as to be capable of obtaining the smallest maximum signal amount among maximum signal amounts of each device according to the flowchart of FIG. 3 (details will be described later). Therefore, X2_max acquired by the device B in S406 is equal to or smaller than X_max in principle. However, a case where X2_max may exceed X_max for some reason is also conceivable. In this case, the flowchart of FIG. 4 may be executed again after the flowchart of FIG. 3 is executed again. As preparation for this, X2_max is acquired in S406 for precaution.

(FIG. 4: Steps S406 to S407: Supplement 2)

It is sufficient to set the second gain to an irradiation point irradiated with the electron beam 1001 first in the device B. Therefore, S406 to S407 may be performed only once for the first time, and may be skipped for subsequent irradiation points.

(FIG. 4: Step S408)

The computer system 1200 sets the second gain specified in S407 for the image forming system 1100. Further, the computer system 1200 adjusts a zero point of the signal amount by the same procedure similar to that of the first offset in S305.

(FIG. 4: Steps S409 to S411)

The computer system 1200 acquires the observation image of the second sample (S409). The computer system 1200 measures, for example, presence or absence of a defect using the acquired observation image (S410). The computer system 1200 performs S404 to S410 on all the wafer patterns (S411).

Figure 5:
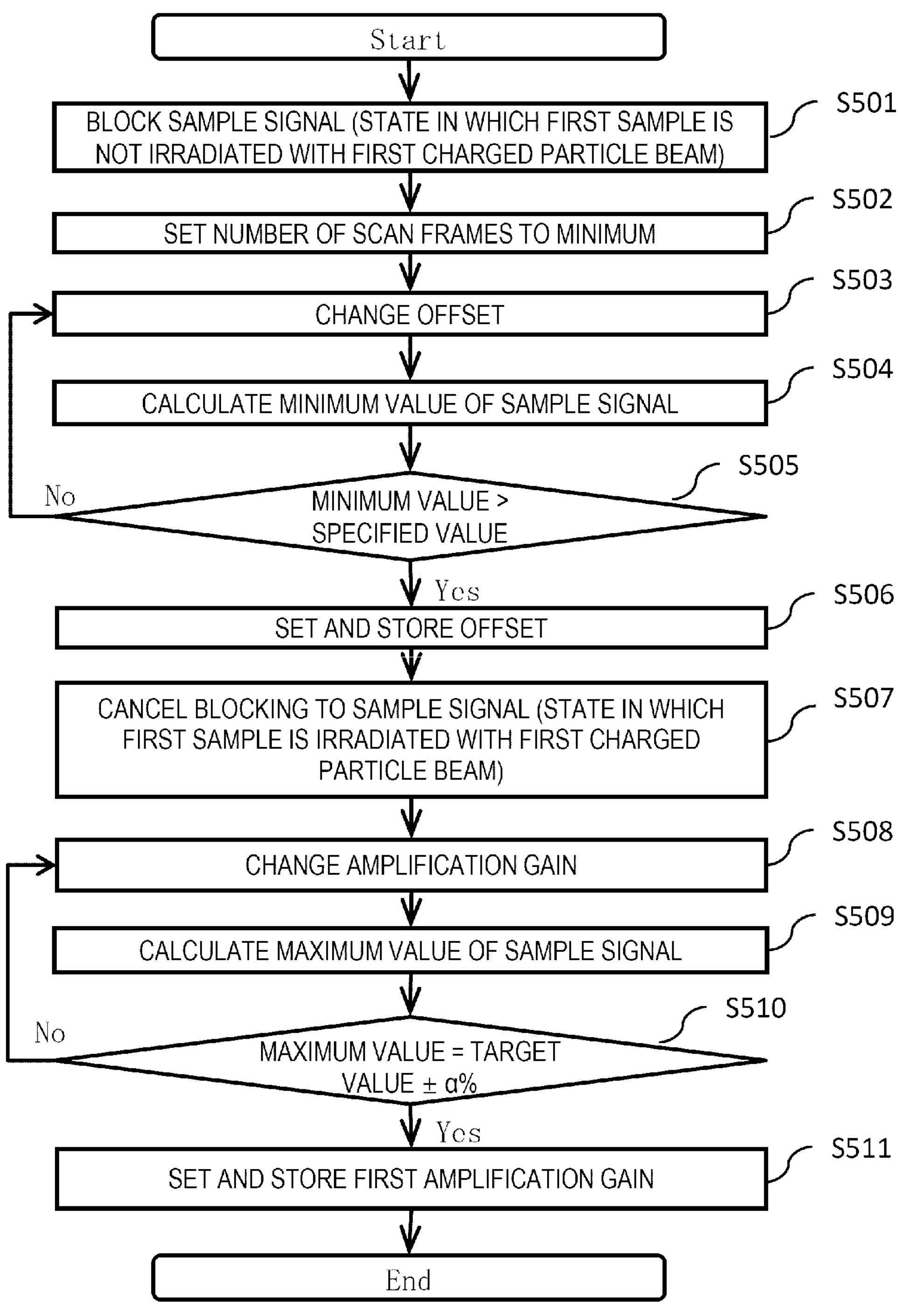
FIG. 5 is a flowchart showing details of S305.

FIG. 5 is a flowchart showing details of S305. S305 is a step for setting a value suitable for a measurement pattern as the signal intensity X in FIG. 2. On the premise of measuring a signal amount of a sample signal, it is necessary to adjust the offset such that the signal amount is sufficiently close to 0 in a state in which the sample signal (signal electron 1004) is blocked. When an offset amount is too large, a measurable range is narrowed, and when the offset amount is too small, a part of the signal amount may not be detected. More appropriately, when the sample signal is not detected, the signal amount is preferably slightly larger than 0. Hereinafter, each step in FIG. 5 will be described.

(FIG. 5: Steps S501 to S502)

The computer system 1200 blocks the electron beam 1001 by the circuit breaker 1010 (S501), and sets the number of scan frames to the minimum (S502).

(FIG. 5: Steps S503 to S506)

The computer system 1200 specifies a minimum value of the detection signal (S504) while changing the offset of the offset adjustment unit 1105 (S503). When the minimum value is equal to or smaller than a specified value, the process returns to S503 and the offset is changed again (S505: No). When the minimum value is larger than the specified value (S505: Yes), the process proceeds to S506. The specified value here is a value slightly larger than 0. The computer system 1200 sets the offset of the offset adjustment unit 1105 and stores the offset in the storage 1201 (S506).

(FIG. 5: Steps S507 to S510)

The computer system 1200 cancels the blocking by the circuit breaker 1010 (S507), and specifies a maximum value of the detection signal (S509) while changing the amplification gain (S508). When the maximum value is a target value (or within an allowable range of ±α% larger or smaller than the target value), the amplification gain at that time is set as the first gain in the device A and is stored in the storage 1201 (S511). When the target value is not satisfied, the process returns to S508 and the gain is changed again.

(FIG. 5: Step S510: Supplement)

The target value in this step is set such that the detection signal of a site to be observed on the sample is not saturated at a peak time. A peak of the detection signal varies depending on which value among gain values included in the characteristic curve acquired in S302 is used. The target value in this step is set such that the peak of the detection signal of the site to be observed is not saturated. Accordingly, a gain suitable for observing a sample to be observed (first sample) on the first reference signal amount characteristic curve can be selected as the first gain.

Embodiment 2

Embodiment 1 describes that the amplification gain is specified such that the same detection signal amount is obtained between the device A and the device B. When the number of devices further increases, for example, the maximum value of the detection signal in one of the devices is smaller than that in other devices, and thus there may be a restriction when the same detection signal level is obtained among the devices. In Embodiment 2 according to the disclosure, a method will be described in which detection signal levels can coincide with each other among devices even in such a case. A configuration of each device is the same as that according to Embodiment 1.

Figure 6:
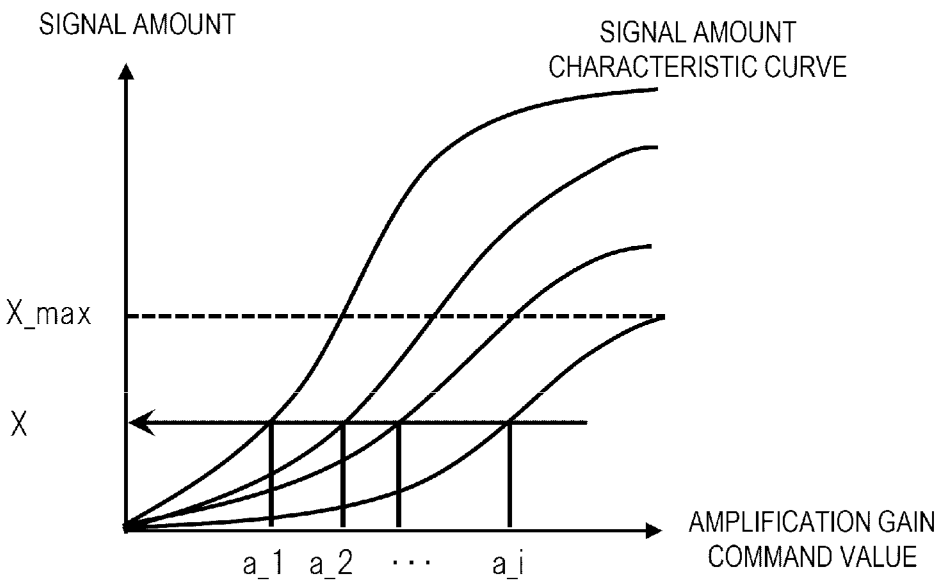
FIG. 6 shows a relationship between a gain command value and a detection signal amount as in FIG. 2.

FIG. 6 shows a relationship between a gain command value and a detection signal amount as in FIG. 2. In FIG. 6, characteristic curves in four devices are shown together. A maximum signal amount of a fourth characteristic curve shown in FIG. 6 is smaller than maximum signal amounts of the characteristic curves in other devices. Therefore, it is desirable that the other three devices adjust gains so as to obtain detection signal levels equal to or smaller than the maximum signal amount in a fourth device. This is because the fourth device cannot obtain a higher detection signal level (cannot adjust the gain to obtain a higher detection signal level). Therefore, when the smallest one of the maximum signal values of each characteristic curve is X_max, each device needs to set a gain so as to obtain a detection signal level equal to or lower than X_max. By using this value as X_max in S307, the same detection signal level can be obtained as in Embodiment 1 even among a large number of devices.

Figure 7:
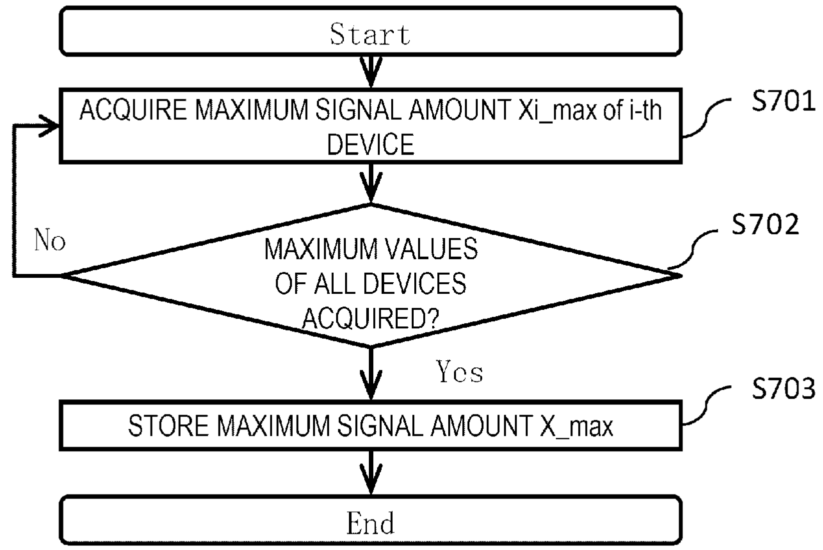
FIG. 7 is a flowchart showing a procedure for acquiring X_max in FIG. 6.

FIG. 7 is a flowchart showing a procedure for acquiring X_max in FIG. 6. This flowchart can be executed by, for example, a device that executes the flowchart of FIG. 3 (a device that provides a signal amount as a reference among devices). Alternatively, any electron microscope device may execute the flowchart and a result thereof may be shared among devices.

The computer system 1200 acquires a maximum value (a maximum value of an i-th device is Xi_max) of a detection signal in each device respectively (S701 to S702). The computer system 1200 specifies the smallest one of the acquired maximum values as X_max and stores X_max in the storage 1201 (S1203). The computer system 1200 transmits X_max to computer systems 1200 of other electron microscope devices, and each device stores X_max in the storage 1201 in the same manner. Subsequent operations are the same as in Embodiment 1.

Embodiment 3

Figure 8:
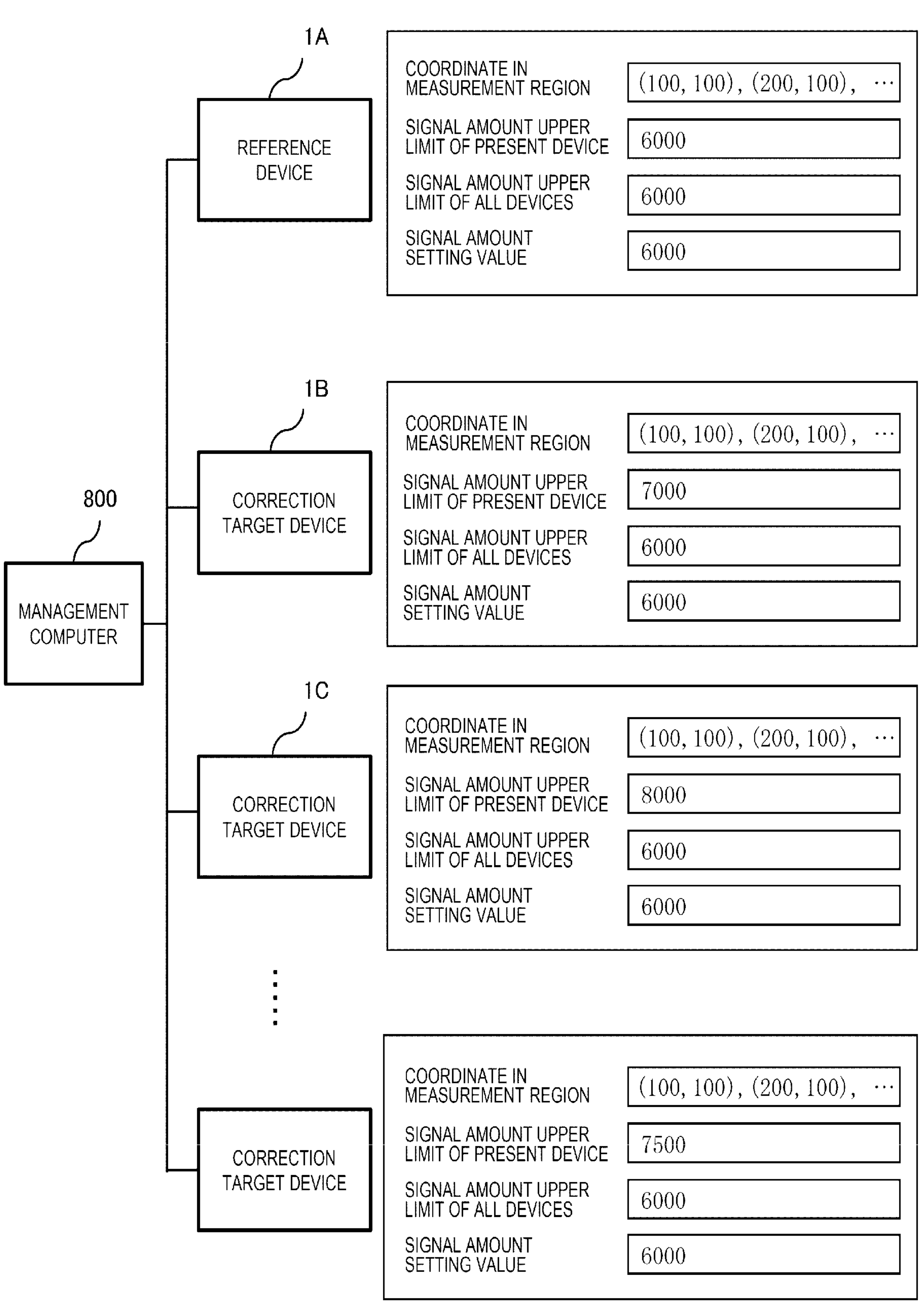
FIG. 8 is a configuration diagram of a charged particle beam system according to Embodiment 3.

FIG. 8 is a configuration diagram of a charged particle beam system according to Embodiment 3 of the disclosure. The present system includes a plurality of electron microscopes 1 described in Embodiments 1 and 2. A device that executes the flowchart of FIG. 3 is referred to as a reference device 1A, and a device that adjusts a gain so as to obtain the same signal amount as a signal amount of the reference device 1A is referred to as a correction target device (1B, 1C, and the like in FIG. 8). The system further includes a management computer 800.

The management computer 800 acquires a characteristic curve described in FIG. 2 from each device, and further acquires Xi_max and X_max described in Embodiment 2. For example, the management computer 800 can create data (measurement recipe) for designating a procedure for inspecting a sample in each device, and distribute X and X_max described in FIG. 6 together to each device when distributing the data to each device. Accordingly, X and X_max can be shared among the devices. The computer system 1200 may have the same role as that of the management computer 800 in any one of the electron microscope devices.

The computer system 1200 in each device may present a user interface shown on a right side of FIG. 8. A signal amount upper limit of all devices indicates X_max. A signal amount upper limit of present device indicates a maximum signal amount in the device. Each device adjusts the gain so as to obtain a signal amount equal to or smaller than X_max, and accordingly, a signal amount setting value is equal to or smaller than X_max. When a measurement recipe using a detection signal level higher than X_max is set, a corresponding warning may be displayed.

Embodiment 4

In the above embodiments, the gain is adjusted to obtain the same detection signal level among the devices. The same gain adjustment may be used to adjust a temporal variation of the detection signal level at different time points in the same device. That is, the characteristic curve 201 in FIG. 2 is acquired at a certain time point (first time point), and the characteristic curve 202 is acquired at a subsequent different time point (second time point) in the same device. The gain command value a at the first time point is changed to the gain command value b at the second time point. Accordingly, detection signal levels at different time points in the same device can be maintained as in Embodiments 1 and 2. Regarding a main body executing each flowchart, the device A may be read as the first time point, and the device B may be read as the second time point.

Regarding a timing at which the computer system 1200 acquires the characteristic curve 202, for example, the characteristic curve 202 may be automatically acquired at each typical time interval at which the temporal variation occurs, or may be prompted by transmitting a message for prompting reacquisition.

As other examples of the timing at which the computer system 1200 acquires the characteristic curve 202, the user may be prompted to reacquire the characteristic curve 202 when the variation of the detection signal amount exceeds a predetermined range, or the characteristic curve 202 may be automatically acquired. Determination of the variation of the signal amount exceeds the predetermined range may be made by monitoring a change of the signal amount when a specific amplification gain is set, by monitoring a change of a plurality of sampling points on the characteristic curve 202, or by a user acquiring the characteristic curve 202 and comparing the acquired characteristic curve 202 with the characteristic curve 202. A determination criterion may be freely determined by the user, or may be stored in the storage 1201 in advance as a device parameter.

The computer system 1200 may reacquire the characteristic curve 202 by a timer that reacquires a signal amount characteristic curve at predetermined time intervals. Alternatively, the characteristic curve 202 may be reacquired by providing a trigger that is activated when the change of the signal amount exceeds the predetermined range.

Modifications of Disclosure

The disclosure is not limited to the embodiments described above, and includes various modifications. For example, the embodiments described above are described in detail for easy understanding of the disclosure, and it is not necessary to include all the described configurations. A part according to one embodiment can be replaced with a configuration according to another embodiment. The configuration according to another embodiment can also be added to the configuration according to one embodiment. A part of the configuration according to each embodiment can also be added, deleted, or replaced with a part of the configuration according to another embodiment.

In the above embodiments, any or all of the image forming system 1100, the computer system 1200, and the control system 1300 may be integrated on a single computer system.

In the above embodiments, as a reference sample (a sample used for acquiring a signal amount characteristic curve), for example, a calibration sample may be used, or a method for obtaining a standard signal equivalent to the reference sample may be used. For example, since a characteristic of the sample is reflected by a mirror electron detected by the detector 1005 without applying the electron beam 1001 to the sample (for example: reflect the electron beam 1001 by an electric field applied to the sample), the mirror electron may be used as the reference sample.

In the above embodiments, it is described that the device A is implemented as the reference device and the device B is implemented as the correction target device. These roles may also be replaced over time. For example, the device B may execute FIG. 4 at a certain time point, and may execute FIGS. 3 and 5 at another time point. Alternatively, the management computer 800 may execute operation procedures of FIGS. 3 to 7 for all the devices.

Although the electron microscope is described as an example of a charged particle beam device in the above embodiments, the disclosure may also be used in charged particle beam devices other than the electron microscope.

In the above embodiments, the detection signal levels are made uniform among the devices. By making the detection signal levels uniform, it is also possible to make luminance values of sample observation images generated using the detection signals of the detection signal levels uniform among the devices. That is, the luminance values can be made uniform among the devices such that the same level of observation accuracy can be obtained in the devices.

In the above embodiments, a reference value acquired by the reference device (device A in the embodiments) may be stored in data that can be shared by the devices, and may be shared by the devices. For example, the first gain specified in FIG. 3 may be recorded in a measurement recipe that can be shared by the devices, and may be shared by the devices.

REFERENCE SIGNS LIST

1: electron microscope
1000: lens barrel portion
1001: electron beam
1002: electron gun
1003: condenser lens
1004: signal electron
1005: detector
1006: deflector
1007: objective lens
1008: sample
1009: stage
1010: circuit breaker
1200: computer system

The invention claimed is:

1. An adjustment method for adjusting an amplification gain of an amplification unit, included in a solid-state electron multiplier tube or a micro channel plate, included in each of a plurality of charged particle beam devices configured to irradiate a sample with a charged particle beam, each of the charged particle beam devices including an irradiation unit configured to emit the charged particle beam, a detector configured to detect a secondary particle generated from the sample due to irradiation on the sample with the charged particle beam and output a detection signal indicating an intensity of the secondary particle, the amplification unit, which is configured to amplify the detection signal, and a processor configured to adjust the amplification gain of the amplification unit, the adjustment method comprising:

a step of acquiring a first correspondence relationship at a first time point between an intensity of the detection signal and the amplification gain in a first charged particle beam device of the plurality of charged particle beam devices;

a step of acquiring a second correspondence relationship at a second time point later than the first time point between the intensity of the detection signal and the amplification gain in the first charged particle beam device, or at the second time point between an intensity of the detection signal and the amplification gain in a second charged particle beam device of the plurality of charged particle beam devices; and a step of specifying, by comparing the first correspondence relationship with the second correspondence relationship, the amplification gain in the first charged particle beam device so as to obtain, at the second time point in the first charged particle beam device, a detection signal intensity with which measurement accuracy or sensitivity equivalent to that of the detection signal of the first charged particle beam device at the first time point or of the second charged particle beam device at the second time point is obtained, and outputting a result thereof.

2. The adjustment method according to claim 1, wherein the processor is further configured to adjust an offset of the detection signal, and the adjustment method further comprises:

a step of acquiring a first intensity acquired by performing, at the first time point on the first charged particle beam device or at the second time point on the second charged particle beam device, a step of acquiring a minimum value of the detection signal while changing the offset in a state in which the sample is not irradiated with the charged particle beam, a step of specifying the offset with which the minimum value is larger than a specified value equal to or larger than zero, and a step of acquiring the first intensity of the detection signal corresponding to the amplification gain by referring to the first correspondence relationship using the specified offset, and in the step of specifying the amplification gain, the amplification gain in the first charged particle beam device is specified such that the first intensity is obtained at the second time point.

3. The adjustment method according to claim 2, wherein in the step of acquiring the first intensity, at the first time point on the first charged particle beam device or at the second time point on the second charged particle beam device, a result is acquired by performing a step of specifying, when the first intensity is equal to or larger than a detection signal upper limit value, the amplification gain with which the detection signal smaller than the detection signal upper limit value is obtained by re-changing the offset and reacquiring the first intensity.

4. The adjustment method according to claim 1, further comprising:

a step of acquiring a first intensity acquired by performing, at the first time point on the first charged particle beam device or at the second time point on the second charged particle beam device, a step of acquiring a maximum value of the detection signal while changing the amplification gain in a state in which the sample is irradiated with the charged particle beam, a step of acquiring the amplification gain with which the maximum value falls within a predetermined range larger or smaller than a target value, and a step of acquiring the first intensity of the detection signal corresponding to the acquired amplification gain by referring to the first correspondence relationship using the acquired amplification gain, wherein in the step of specifying the amplification gain, the amplification gain in the first charged particle beam device is specified such that the first intensity is obtained at the second time point.

5. The adjustment method according to claim 4, wherein in the step of acquiring the first intensity, at the first time point on the first charged particle beam device or at the second time point on the second charged particle beam device, a result is acquired by performing a step of specifying, when the first intensity is equal to or larger than a detection signal upper limit value, the amplification gain with which the detection signal smaller than the detection signal upper limit value is obtained by re-changing the amplification gain and reacquiring the first intensity.

6. The adjustment method according to claim 1, wherein the processor is further configured to adjust an offset of the detection signal, and the adjustment method further comprises:

a step of acquiring a minimum value of the detection signal while changing the offset in a state in which the sample is not irradiated with the charged particle beam;

a step of specifying the offset with which the minimum value is larger than a specified value equal to or larger than zero; and a step of generating an observation image of the sample using the specified offset and the specified amplification gain.

7. The adjustment method according to claim 1, further comprising:

a step of acquiring a first maximum value of the detection signal in the first charged particle beam device; and a step of acquiring a second maximum value of the detection signal in the second charged particle beam device, wherein in the step of specifying the amplification gain, the amplification gain is specified such that a smaller one of the first maximum value and the second maximum value is obtained in the first charged particle beam device.

8. The adjustment method according to claim 1, further comprising:

a step of reacquiring the first correspondence relationship at least at one of a time point at which the first correspondence relationship is changed by a threshold or more or a time point at which a predetermined time elapses after the first correspondence relationship is acquired; and a step of reacquiring the second correspondence relationship at least at one of a time point at which the second correspondence relationship is changed by a threshold or more or a time point at which a predetermined time elapses after the second correspondence relationship is acquired.

9. The adjustment method according to claim 1, wherein in the step of acquiring the first correspondence relationship, the first correspondence relationship is acquired using, as the sample, a mirror secondary particle acquired by the detector while applying the charged particle beam to a first calibration sample or the sample, and in the step of acquiring the second correspondence relationship, the acquired second correspondence relationship is acquired by the second charged particle beam device using, as the sample, a mirror secondary particle acquired by the detector while applying the charged particle beam to a second calibration sample or the sample.

10. The adjustment method according to claim 1, further comprising:

a step of uniformizing, by specifying the amplification gain in the first charged particle beam device, a luminance value of an observation image of the sample acquired by the first charged particle beam device and a luminance value of an observation image of the sample acquired by the second charged particle beam device within a range in which the same degree of observation accuracy is obtained.

11. The adjustment method according to claim 2, further comprising:

a step of storing the acquired first intensity in data that is sharable between the first charged particle beam device and the second charged particle beam device.

12. The adjustment method according to claim 11, further comprising:

a step of sharing the first intensity between the first charged particle beam device and the second charged particle beam device by sharing the data in which the first intensity is recorded between the first charged particle beam device and the second charged particle beam device.

13. The adjustment method according to claim 1, further comprising:

a step of generating an observation image of the sample using the specified amplification gain.

14. A charged particle beam device comprising:

a computer system configured to execute the adjustment method according to claim 1.

15. A charged particle beam system comprising:

a computer system configured to execute the adjustment method according to claim 1;

the first charged particle beam device; and the second charged particle beam device.

16. The charged particle beam system according to claim 15, wherein the computer system is configured to perform a step of acquiring a first maximum value of the detection signal in the first charged particle beam device, a step of acquiring a second maximum value of the detection signal in the second charged particle beam device, and a step of sharing a smaller one of the first maximum value and the second maximum value between the first charged particle beam device and the second charged particle beam device, and in the step of specifying the amplification gain, the computer system specifies the amplification gain such that the smaller one of the first maximum value and the second maximum value is obtained in the first charged particle beam device.

* * * * *